United States Patent [19]
Kuo

[11] Patent Number: 5,971,680
[45] Date of Patent: Oct. 26, 1999

[54] AUTOMATIC PRINTED CIRCUIT BOARD TWO-BEVEL FORMING MACHINE

[75] Inventor: Hsien-Li Kuo, Taoyuan Hsien, Japan

[73] Assignee: Der Lih Fuh Co., Ltd., Taoyuan, Taiwan

[21] Appl. No.: 09/039,697

[22] Filed: Mar. 16, 1998

[51] Int. Cl.⁶ ..................................................... B23C 1/30
[52] U.S. Cl. ........................ 409/138; 409/192; 409/207; 451/44
[58] Field of Search ..................... 451/44, 262; 409/207, 409/218, 204, 217, 138, 139, 198, 192, 203

[56] References Cited

U.S. PATENT DOCUMENTS

| | | | |
|---|---|---|---|
| 1,913,781 | 6/1933 | Wiley et al. | 409/203 |
| 2,327,407 | 8/1943 | Edyvean | 409/138 |
| 2,548,188 | 4/1951 | Armitage et al. | 409/192 |
| 3,610,098 | 11/1968 | Walker | 409/203 |
| 4,228,617 | 10/1980 | Bando | 451/44 |
| 4,514,121 | 4/1985 | Fuchs, Jr. | 409/138 |
| 4,985,982 | 1/1991 | Lohr et al. | 29/566.001 |
| 5,117,590 | 6/1992 | Kudo et al. | 451/44 |
| 5,327,686 | 7/1994 | Park | 451/44 |

*Primary Examiner*—Andrea L. Pitts
*Assistant Examiner*—Adesh Bhargava

[57] ABSTRACT

Disclosed is an automatic printed circuit board two-bevel forming machine which includes a conveyer, a first cutter assembly which is disposed above the conveyer, and a second cutter assembly which is disposed below the conveyer. The first cutter assembly includes a first rough and a first fine bevel cutter. The second cutter assembly includes a second rough and second fine bevel cutter. The rough and fine bevel cutters of the first and second cutter assemblies incline at a suitable angle toward the upper and lower edges of the PCBs being conveyed. The rough and fine cutters stretch or shrink to a suitable position controlled by a pneumatic driving device. When the PCBs pass through the first and second cutter assemblies sequentially by means of the conveyer, the rough and fine bevel cutters of the first cutter assembly cut and grind the upper edge to form an upper fine bevel, and the rough and fine bevel cutters of the second cutter assembly cut and grind the lower edge to form a lower fine bevel. A very fine two-bevel edge is obtained without any manual operations, and the manufacture cost is thus reduced.

3 Claims, 4 Drawing Sheets

AUTOMATIC PRINTED CIRCUIT BOARD TWO-BEVEL FORMING MACHINE

FIELD OF THE INVENTION

The invention relates to an automatic printed circuit board two-bevel forming machine, particularly to a two-bevel forming machine which automatically cuts an edge of the printed circuit board to form a two-bevel edge through two cutting procedures by two cutter assemblies. The present invention obtains very fine two-bevel edge, does not need manual operations, and reduces the manufacture cost.

BACKGROUND OF THE INVENTION

Conventionally, when the printed circuit board (PCB) to be manufactured into an interface card is produced, a plurality of golden fingers are formed at the edges of the printed circuit board as shown in FIG. 8. When the printed circuit board is inserted into a connector of the mother board, the golden fingers contact the conductive pad of the connector in order to connect the printed circuit board to the mother board. For facilitating the insertion of the printed circuit board into the connector and in order to remove burrs at the edges of the printed circuit board, the edges having golden fingers on the printed circuit board should be shaped to form a two-bevel edge.

It is the last step of the PCB manufacture process to form the two-bevel edge on the PCB. After the copper circuitry and golden fingers are formed and laid out on the PCB, one edge of the PCB is placed in the bevel forming channel. A cutter similar to the planing cutter is disposed in the bevel forming channel. Then, the operator uses his hands to move the PCB ahead along the channel swiftly so that a bevel is formed and shaped at one edge of the PCB by the cutter. The PCB is turned up-side-down and moved along the channel again to form the two-bevel edge on the PCB. The above two-bevel edge forming process for PCB have the following disadvantages:

(A) When the bevel plane is formed at the edges of the PCB, the copper golden finger is lifted up by the planing cutter and burrs is formed to injure the PCB. The yield is very low and the manufacture cost is very high.

(B) The efficiency of the conventional process for forming the two-bevel edge manually on the PCB is very low. The manual process prohibits the PCB having the two-bevel edge from mass-production and cannot reduce the manufacture cost. The operator must have a skillful technique.

(C) After the plane cutter is operated for a while, its length is reduced because of abrasion. Conventionally, it is quiet inconvenient and takes a lot of time to adjust the length of the plane cutter. The working efficiency cannot be increased.

SUMMARY OF THE INVENTION

It is an object of the present invention to provide an automatic printed circuit board two-bevel forming machine which comprises a conveyer, a first and a second cutter assemblies disposed at one or more side of the conveyer. The first and second cutter assemblies respectively comprises a first rough bevel cutter and a first fine bevel cutter, and a second rough bevel cutter and a second fine bevel cutter which slantingly stretch or shrink to a predetermined length by a pneumatic driving device. When the PCBs pass through the first and second cutter assemblies sequentially by means of the conveyer, the rough and fine bevel cutters of the first and second cutter assemblies automatically cut and grind at least one upper edge and one lower edge to form the two fine bevels in order to prevent the golden fingers from damage, thereby the quality becomes better and the cost decreased.

It is another object of the present invention to provide an automatic printed circuit board two-bevel forming machine which automatically controls the bevel forming procedure in order to avoid using the manual operation technology and to reduce the labor cost.

It is another object of the present invention to provide an automatic printed circuit board two-bevel forming machine which further provides a pair of adjustment tools which swiftly adjust the length of newly-installed bevel cutters. The new bevel cutters which are disposed to replace the bevel cutters worn away are calibrated to adjust their length in a very short time so that the cutting and grinding is accurate.

It is another object of the present invention to provide an automatic printed circuit board two-bevel forming machine which comprises a conveyer, a first cutter assembly which is disposed above the conveyer, and a second cutter assembly which is disposed below the conveyer. The first cutter assembly comprises a first rough bevel cutter disposed near the conveyer and a first fine bevel cutter at the downstream of the conveyer relative to the second rough bevel cutter. The rough bevel cutter and fine bevel cutter of the first and second cutter assemblies incline at suitable angle toward the upper and lower edges of the PCBs being conveyed. The rough and fine cutters stretch or shrink to a suitable position controlled by a pneumatic driving device. When the PCBs pass through the first and second cutter assemblies sequentially by means of the conveyer, the rough and fine bevel cutters of the first cutter assembly cut and grind the upper edge to form an upper fine bevel, and the rough and fine bevel cutters of the second cutter assembly cut and grind the lower edge to form a lower fine bevel.

BRIEF DESCRIPTIONS OF THE DRAWINGS

DETAILED DESCRIPTIONS OF THE INVENTION

Figure 1:
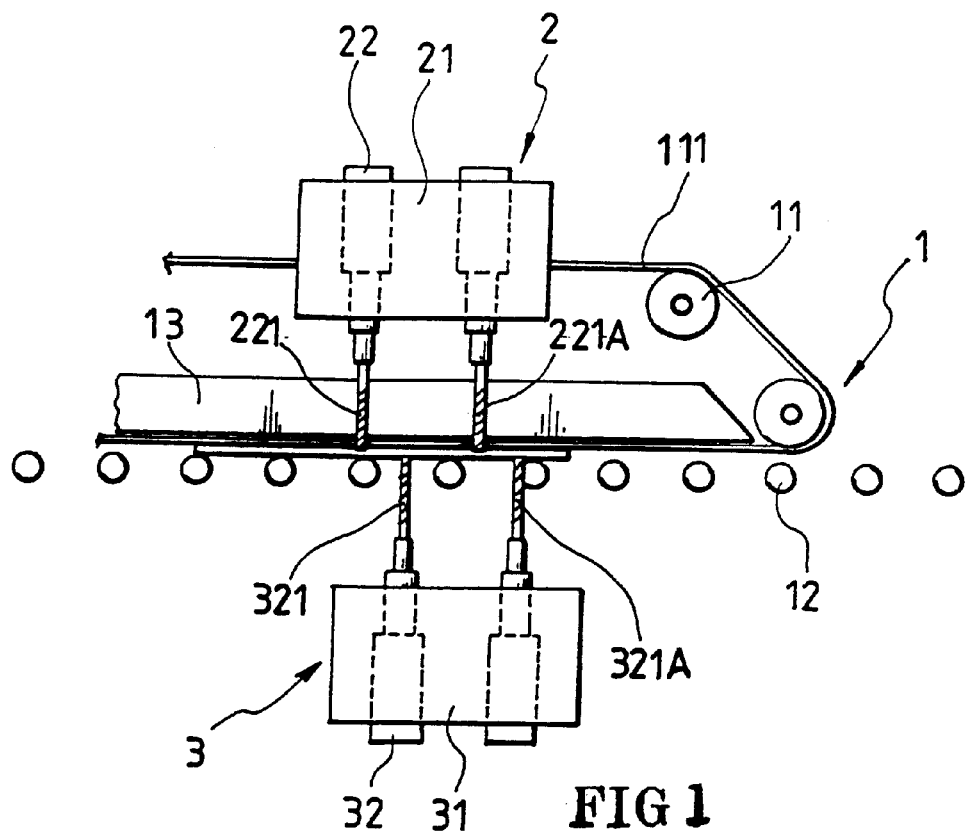
FIG. 1 is a left side view of the automatic printed circuit board two-bevel forming machine of the present invention showing that a PCB is moving on the conveyer to be cut.
Figure 2:
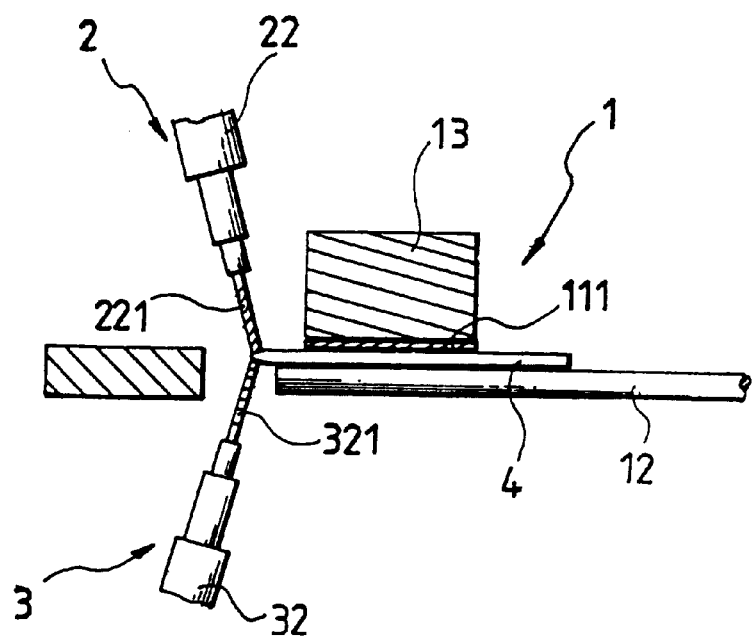
FIG. 2 is a front schematic view of the automatic printed circuit board two-bevel forming machine of the present invention showing a side view of FIG. 1.

As shown in FIGS. 1 and 2, the automatic printed circuit board two-bevel forming machine of the present invention comprises a conveyer 1, a first cutter assembly 2 and a second cutter assembly 3.

The conveyer 1 comprises a guide seat 13 on the two-bevel forming machine; a plurality of belt pulleys 11 which are disposed near the guide seat 13 on the two-bevel forming machine; a belt 111 which passes through the lower surface of the guide seat 13; and a plurality of conveying rollers 12 which are disposed on the two-bevel forming machine and which are driven by a motor and a reduction gearing system (not shown). The printed circuit board 4 is placed on the conveying roller 12 and is transported to the right side. When printed circuit board 4 is transported below the guide seat 13 and contacts the belt 111, it is transported by the conveying roller 12 because it is held between the belt 111 and the conveying roller 12. Then the printed circuit board 4 does not deviate from its normal path during transportation.

The first cutter assembly 2 is mounted atop the conveyer 1 at one side of the conveyer 1. The first cutter assembly 2 comprises a first cutter seat 21 which is disposed and fixed at a suitable place on the two-bevel forming machine. A first rough bevel cutter 221 and a first fine bevel cutter 221A are mounted on the first cutter seat 21. The first rough bevel cutter 221 and first fine bevel cutter 221A are respectively disposed at upstream and downstream positions of the conveyer 1. The first rough bevel cutter 221 and the first fine bevel cutter 221A are mounted on the first cutter holders 22 which is secured to the first cutter seat 21. The first cutter holder 22 which inclines toward the first cutter seat 21 is fixed to the first cutter seat 21. The first rough and fine cutters 221,221A incline at a suitable angle toward the upper edge of the printed circuit board 4 being transported. The movement of first rough and fine cutters 221,221A, i.e., the extending and shrinking of the first rough and fine cutters 221,221A, is controlled by a pneumatic driving device (not shown). The first cutter holder 22 is removable and mountable from the first cutter seat 21.

The second cutter assembly 3 is mounted below the conveyer 1 at one corresponding location to the first cutter assembly 2. The second cutter assembly 3 comprises a second cutter seat 31 which is disposed and fixed at a suitable place on the two-bevel forming machine. A second rough bevel cutter 321 and a second fine bevel cutter 321A are mounted on the second cutter seat 31. The second rough bevel cutter 321 and second fine bevel cutter 321A are respectively disposed at the upstream and downstream positions of the conveyer 1. The second rough bevel cutter 321 and the second fine bevel cutter 321A are mounted on the second cutter holders 32 which is secured to the second cutter seat 31. The second cutter holder 32 which inclines toward second cutter seat 31 is fixed to the second cutter seat 31. The second rough and fine cutters 321,321A incline at suitable angle toward the lower edge of the printed circuit board 4 being transported. The movement of the second rough and fine cutters 321,321A, i.e., the extending and shrinking of the second rough and fine cutters 321,321A, is controlled by a pneumatic driving device (not shown). The second cutter holder 32 is removable and mountable from the first cutter seat 21.

In view of the first and second cutter assemblies 2,3, the first and second rough cutters 221,321 are respectively mounted at the upstream locations compared to the locations of the first and second fine cutters 221A,321A along the moving path of the conveyer 1. The first rough and fine cutters 221,221A are located above the second rough and fine cutters 321,321A.

Figure 3:
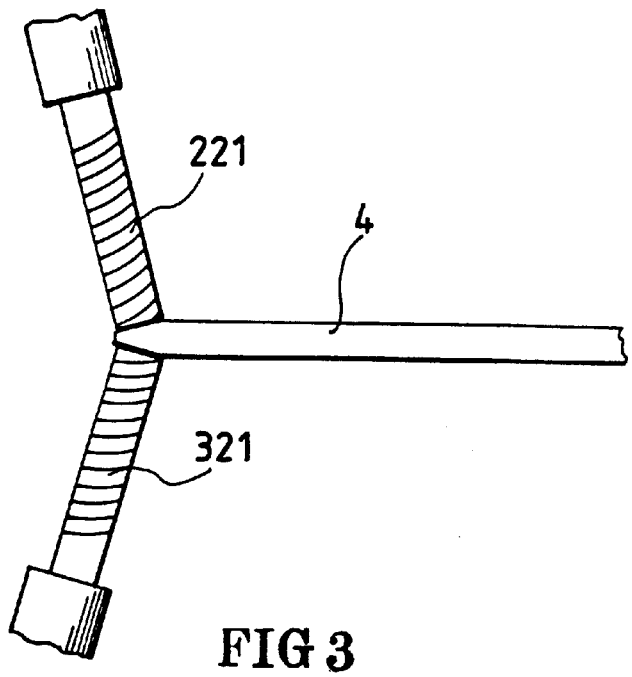
FIG. 3 is a partially enlarged view of the automatic printed circuit board two-bevel forming machine of the present invention showing an enlarged view of FIG. 2.
Figure 4:
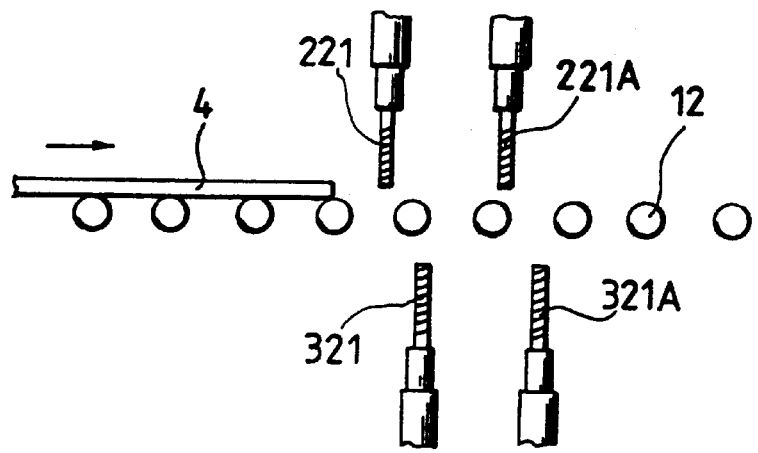
FIG. 4 is a partial side view of the automatic printed circuit board two-bevel forming machine of the present invention showing that, when a PCB is transported, the first cutter assembly descends to cut the upper edge of the printed circuit board.
Figure 5:
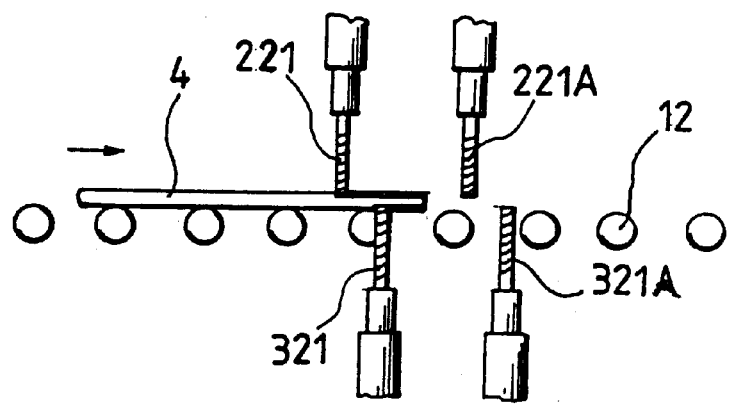
FIG. 5 is a partial side view of the automatic printed circuit board two-bevel forming machine of the present invention showing that, when rough bevel cutter of the first cutter assembly is cutting the upper edge of the printed circuit board, the second cutter assembly ascends to cut the lower edge of the printed circuit board.

By means of the two-bevel forming machine of the present invention, when the printed circuit board 4 moves through first and second cutter assemblies 2,3, the first rough and fine cutters 221,221A extend downward a suitable displacement which is controlled as shown in FIG. 4. The displacement of the first fine cutter 221A is larger than that of the first rough cutter 221 so that the printed circuit board 4 is cut by the first rough cutter 221 during transportation. Before the whole printed circuit board 4 move through the second rough cutter 321, the second rough and fine cutter 321,321A extend upward to a suitable position as shown in FIG. 5. The displacement of the second fine cutter 321A is larger than that of the second rough cutter 321 so that the upper and lower edges of the printed circuit board 4 is rough cut by the first and second rough cutters 221,321 ,and fine cut by the first and second fine cutter 221A,321A as shown in FIG. 3 to obtain the fine two-bevel edge. Because the first and second rough and fine cutters 221,221A,321,221A are slantingly disposed, the first rough and fine cutters 221,221A will not respectively collide with the second rough and fine cutters 321,321A during the transportation of the printed circuit board 4 because the extending directions of any two cutters do not lie in a same single line.

Figure 6:
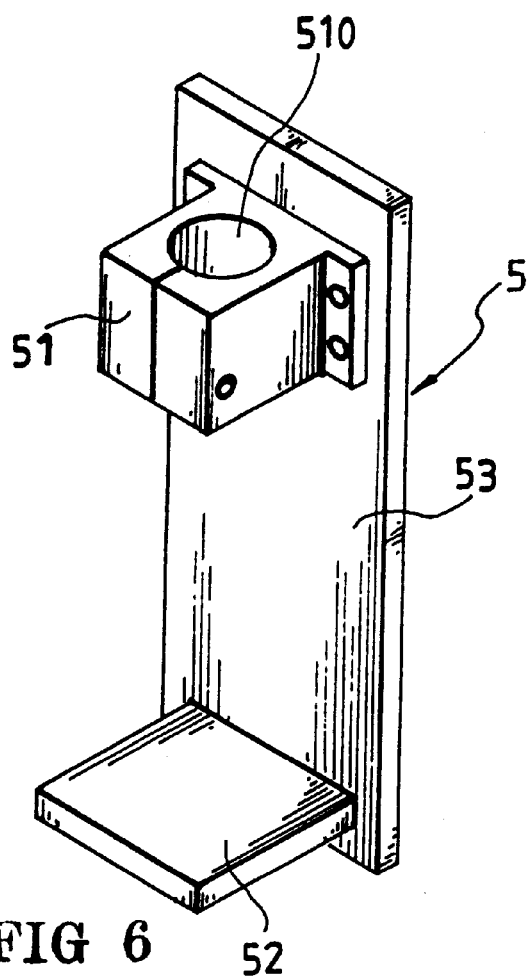
FIG. 6 is an isometric view of the adjustment tool of the present invention.
Figure 7:
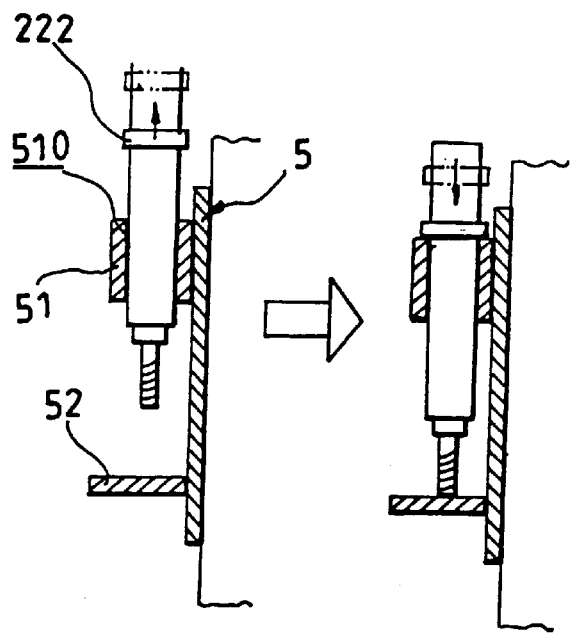
FIG. 7 is a cross-sectional view of the present invention showing that a bevel cutter is mounted on the adjustment tool of FIG. 6 to adjust the bevel cutter.
Figure 8:
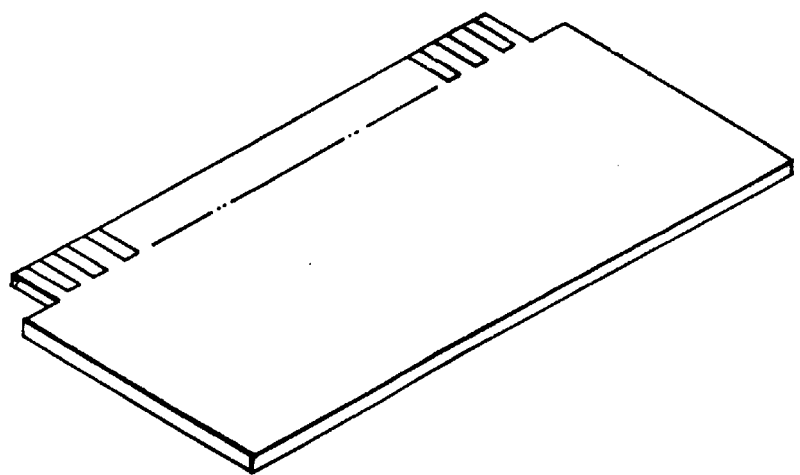
FIG. 8 is an isometric view of the printed circuit board of the present invention.

The end of the cutters 221,221A,321,321A are worn away after a long time use and the length of them is reduced. In order to accurately cut the edge of the printed circuit board, the cutters which are worn away should be replaced by new ones. The new cutter must have a same length as that of the original cutter so that the new cutter can accurately cut the printed circuit board. In order to swiftly and accurately calibrate the cutters, a pair of adjustment tools 5 of which one is shown in FIG. 6 are mounted on the suitable position of the two-bevel forming machine. The adjustment tool 5 comprises a fixing body 53 which may be secured to the two-bevel forming machine, a test head 51 and a plate 52 which are fixed to the fixing body 53. The test head 51 has a hole 510. The distance between the upper surface of the test head 51 and the plate 52 of one adjustment tool is set to be equal to the length of the first and second rough cutters 221,321. The distance between the upper surface of the test head 51 and the plate 52 of the other adjustment tool is set to be equal to the length of the first and second fine cutters 221A,321A. When the cutters are worn away, the cutters may be dismantled from the first and second cutter seat 21,31 and replaced by new cutters. Then, the positioning ring 222 is released and pushed backward. The new cutter passes downward through the hole 510 of the test head 51 so that the end of the cutter is placed naturally on the plate 52. Then, the positioning ring 222 is pushed forward to a position above the test head 51 to fix the positioning ring 222 as shown in FIG. 7. The length of the cutters can be regulated swiftly to a predetermined value.

The present invention has the following advantages:

1. In the present invention, the cutters rotate to cut the upper and lower edges of the printed circuit board, the golden fingers on the printed circuit board are not lifted and damaged. The high yield of the printed circuit board can be retained. The fine two-bevel edge of the printed circuit board is formed automatically by means of the rough and fine cutting by using the rough and fine cutters in order to get high quality and to decrease the manufacture cost.
2. Because the edge of the printed circuit board is automatically cut, the manual operation skill is not needed and the labor cost is reduced.
3. The adjustment tool can calibrate the worn cutters which become short after long time operation. The edge of the printed circuit board is accurately cut and working efficiency is increased.

While the invention has been particularly shown and described with reference to these preferred embodiments, it will be understood by those skilled in the art that various changes in form and details may be made without departing from the spirit and scope of the invention. Although only the preferred embodiments of this invention were shown and described in the above description, it is requested that any modification or combination that comes within the spirit of this invention be protected.

I claim:

1. An automatic printed circuit board two-bevel forming machine comprising:

a conveyer for transporting a printed circuit board;

a first cutter assembly which is disposed above the conveyer and which comprises a first rough bevel cutter and a first fine bevel cutter, the first rough and fine bevel cutters inclining at a suitable angle toward an edge of the printed circuit board being transported, and extending or contracting the first rough and fine bevel cutters to a controlled position;

a second cutter assembly which is disposed below the conveyer and which comprises a second rough bevel cutter and a second fine bevel cutter, the second rough and fine bevel cutter inclining at a suitable angle toward an edge of the printed circuit board being transported, and extending or contracting the second rough and fine bevel cutters to a controlled position; and an adjustment tool for calibrating the cutters, the adjustment tool comprising a fixing body, a test head being fixed to the fixing body and having a positioning ring, and a plate being secured to the fixing body and spaced from the test head at a predetermined distance.

2. The two-bevel forming machine as claimed in claim 1, wherein the first and second rough bevel cutters are respectively mounted at upstream locations compared to locations of the first and second fine cutters.

3. The two-bevel forming machine as claimed in claim 1, wherein, when the printed circuit board passes through the first and second cutter assemblies sequentially by means of the conveyer, the first rough and fine cutters cut the edge of the printed circuit board, and then, the second rough and fine cutters cut the edge of the printed circuit board.

* * * * *

UNITED STATES PATENT AND TRADEMARK OFFICE
CERTIFICATE OF CORRECTION

PATENT NO. : 5,971,680

DATED : October 26, 1999

INVENTOR(S) : Hsein-Li Kuo

It is certified that error appears in the above-identified patent and that said Letters Patent is hereby corrected as shown below:

On the Title page, line [75], change "Japan" to --Taiwan--.

Signed and Sealed this

Twentieth Day of June, 2000

*Attest:*

*Attesting Officer*

Q. TODD DICKINSON

*Director of Patents and Trademarks*